Nov. 29, 1960 J. I. RHODES 2,962,668
TRANSISTOR OSCILLATOR
Filed June 2, 1958
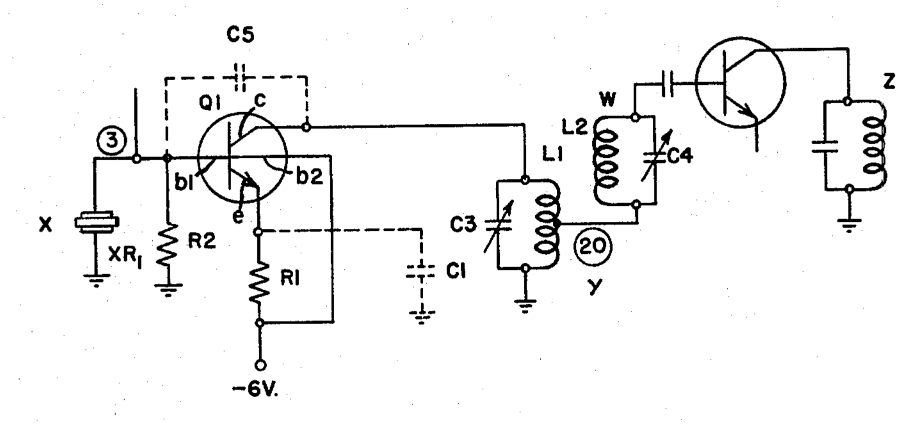
INVENTOR:
JUNIOR I. RHODES,
BY Joseph P. Kates
HIS ATTORNEY.

United States Patent Office 2,962,668

Patented Nov. 29, 1960

2,962,668

TRANSISTOR OSCILLATOR

Junior I. Rhodes, North Syracuse, N.Y., assignor to General Electric Company, a corporation of New York Filed June 2, 1958, Ser. No. 739,289

7 Claims. (Cl. 331—116)

The present invention relates to an oscillator and more particularly relates to a crystal controlled high frequency junction transistor oscillator especially adaptable for operation wherein a crystal may be oscillated as the third overtone at a frequency range desirably at although not necessarily limited to between 20 megacycles and 75 megacycles.

Prior art crystal oscillators, for example, the transistor oscillator of Bopp et al., Patent No. 2,770,731, issued November 13, 1956, and the crystal controlled oscillator of Eberhard et al., Patent No. 2,570,436, issued October 9, 1951, employed point contact transistors. Such prior art oscillators had certain disadvantages, for example, they were unreliable in operation, they were incapable of sufficient power dissipation, they were mechanically weak and could not be readily utilized in applications such as for mobile two-way radio systems wherein additions of high shock and vibration were involved, and prior art oscillators utilizing point contact transistors or tubes were unacceptable because they tended to generate internal noise which caused distortion or unpleasant effects at the output of receivers utilizing such devices and caused transmitters to transmit distorted signals.

In the case of prior art systems utilizing tubes, disadvantages included low overall power efficiency, requirement for greater power consumption making them unadaptable for applications wherein batteries or other power supplies of low power output needed to be utilized, requirements for warm up time before going on the air and relatively short life.

The present invention overcomes these and other deficiencies of the prior art and in addition provides a circuit capable of relatively high power output utilizing junction transistors which circuit is readily adaptable for operation over the range of frequencies desired and which will utilize a crystal at its optimum upper range of operation.

Attempts to produce an analogue to the vacuum tube Miller oscillator in circuits utilizing a junction transistor oscillator under the principle of duality have been unsuccessful. One reason for this, is the high emitter junction diode capacitance in the transistor. This capacitance normally appears in shunt with the crystal in such an oscillator, and in this condition results in capacitance loading in such amount that the total emitter-base circuit impedance can never become resistive. Under these circumstances, oscillation is impossible.

Accordingly an object of the present invention is to provide a transistor oscillator utilizing junction transistors and which will be adaptable for use within a frequency range preferably of, but not limited to, the order of 20 to 75 megacycles and which will modify the adverse effects of analogues to tube circuits overcoming deficiencies of base to emitter diode capacitance causing excessive capacitance loading such that oscillation could not take place.

Another purpose of the present invention is to provide an oscillator utilizing a junction transistor which will be of highly stable configuration and which will be operable within third and higher modes and be operable with a detunable tank output to enable operation to be effected both at the mode frequency and at multiples of the mode crystal output frequency.

Another aim of the present invention is to provide a transistor oscillator capable of high power dissipation, which will be stable in configuration permitting stable and effective oscillation under a wide variety of conditions wherein oscillators must undergo considerable mechanical shock under stresses and strains not ordinarily encountered in other types of oscillators and which will be capable of extremely good response over a wide range of ambient temperature and pressure conditions.

Another object of the present invention is to provide a transistor oscillator especially adaptable for mobile two-way radio communication purposes and which will be highly advantageous in that necessity for temperature compensation will be eliminated and frequency drift will be avoided.

Another object of the present invention is to provide a transistor oscillator which will be simple in design, which will have a minimum of expensive components such as inductors required for operation thereof, and wherein ambient changes in temperature will follow the characteristics of the crystal due to the inclusion of compensating elements within the circuitry.

While the novel and distinctive features of the invention are particularly pointed out in the appended claims, a more expository treatment of the invention, in principle and in detail, together with additional objects and advantages thereof, is afforded by the following description and accompanying drawings in which:

The figure constitutes a schematic representation of a preferred embodiment of the present invention.

Referring to the figure of the drawing, a transistor Q1 may be provided which will have a collector *c*, a first circuit base *b1*, a second base *b2*, and an emitter *e*. Transistor Q1 may, for example, be a General Electric Company type designation known as a 3N37 transistor. Disposed between the emitter *e* and a source of voltage which may, for example, be of the order of minus 6 volts may be a resistor R1. Disposed between the emitter *e* and ground reference may be capacitance C1. The capacitance C1 may be the capacitance due to stray wiring in the circuit but is essential for a purpose to be described. Disposed between the base *b1* and ground may be a parallel circuit comprising a crystal $XR_1$ which may, for example, operate at a basic frequency of 50 megacycles and a resistor R2. Disposed between the collector *c* of transistor Q1 and ground may be a tank circuit which may comprise a parallel circuit including an inductor L1 and a tunable capacitor C3. Tapped off inductance L1 may be a second tuned circuit which may comprise a parallel resonant circuit including an inductor L2 and a tunable capacitor C4. A load for the oscillator, including inductor L2 and tunable capacitor C4, may be provided as shown in the right hand portion of the figure. A second base *b2* may be provided for junction transistor Q1 which base *b2* may be electrically directly connected to the negative 6 volt supply to provide for bias therebetween.

With the imposition of the emitter voltage, the circuit will operate practically instantaneously and may be explained as follows:

Current will be caused to flow through resistor R1 and through the transistor in a manner known to the art. In order to sustain oscillations feedback must result. This feedback is provided as follows. The tuned circuit comprising capacitor C3 and inductor L1 will be tuned slightly inductive. When an A.-C. signal is applied at the base it will undergo a 180° shift in phase at the collector. Capacitance occurs in junction transistor Q1 between the collector $c$ and base $b1$ designated by the dashed line representation of capacitance C5.

Because the current in flowing through the junction transistor will undergo a 180° phase reversal at the collector, and it is necessary in order to sustain oscillations to provide regenerative feedback, the regenerative feedback may be supplied by tuning the output tank circuit comprising capacitor C3 and inductor L1 to be slightly inductive at the frequency of oscillation desired and by providing capacitive feedback through the transistor through internal capacitance C5. This will occur because due to the inductance in the output tank circuit C3 and inductor L1, the voltage at the collector will lead the current by 90°. In addition, in going through the internal capacitance of the transistor the current will lead the voltage by 90°. Thus, in the feedback to the circuit base circuit there will be a total of 180° transition in phase which will cause regenerative energy to be applied to the circuit base circuit of crystal $XR_1$ and resistor R2. The feedback voltage thus being in phase, an energy kick will occur at the desired frequency (the crystal frequency). Because of the stray capacitance represented by capacitor C1 shown in dashed lines, compensation will be effected for the base $b1$ circuit comprising crystal $XR_1$ and resistor R2 always being capacitive in nature.

Thus, the stray capacitance furnished by the wiring C1 when considered in connection with the capacitance of the input circuit disposed between base $b1$ and ground therefore provides an anti-resonant condition in the input circuit which since the input circuit has the characteristics of a parallel tuned circuit provides for the very high impedance and unity power factor necessary for resonance and hence oscillation of the oscillator circuit of the figure.

That is, it is insured that a capacitance C1 of value sufficient to compensate for the capacitance desired in the base $b1$ to ground input circuit is applied in series with the emitter diode, or between the emitter and ground. This effectively reduces the capacitance from base $b1$ or the circuit base to ground to enable the input circuit to become resistive, a condition required for the then anti-resonant input parallel tank circuit to enable oscillation.

To insure that feedback will be in correct phase at the frequency of oscillation desired, the output tuned tank circuit comprising capacitor C3 and inductor L1 should be made very slightly inductive. Utilizing a transistor and in particular a junction transistor a very small inductance is needed when the oscillator is tuned to relatively high frequencies. This is due to the tremendous current gain, an inherent property of such a transistor which is a very high current gain device. Because of the feature of the output tuned circuit L1 and C3, the oscillator of the present invention may be utilized at modes higher than the first mode of the crystal, for example, in one version of the inventive transistor oscillator the third mode may readily be obtained. In addition, frequency multiplying as, for example, frequency doubling, tripling, quadrupling and so forth because of the tuning of the output tank circuit C3 and L1 may readily be effected. Thus, with a crystal at 50 megacycles operating at the third mode, 150 megacycles operation at the input circuit would result and if the output tank were tuned to the third harmonic then an output frequency of 150 megacycles could result. This principle might be utilized ad infinitum, for example, up to 750 megacycles for a 50 megacycle crystal. It will also be readily understood that the principle of the output tank circuit in conjunction with the present inventive circuit might be utilized for very much higher frequencies, for example, of the order of hundreds of megacycles depending upon the natural resonant frequency of the crystal $XR_1$. It should be understood, of course, that the output frequencies will also depend upon the characteristics of the particular junction transistor utilized in the circuit.

When power is applied at the emitter $e$ of transistor Q1 from the negative 6 volts source, operation of the oscillator occurs in a manner somewhat similar to operation of discharge device oscillators where the phase shift between the input circuit and the output circuit is approximately 180° and power gain results. When the output circuit is inductive at the frequency at which the input circuit is resonant, the input circuit being made resonant by the parallel combination of an inductive reactance with the input capacitance of the circuit, oscillation is possible. This is comparable to the tuned-plate tuned-grid vacuum tube oscillator, the Armstrong vacuum tube oscillator. In the present circuit, the combination of the peculiar characteristics of the transistors used when combined with the effect of the capacitance C1 in the emitter circuit produces a condition of gain in the overall system so that the frequency of resonance of the output collector circuit, can be tuned to a frequency many times the oscillating frequency of the overall oscillator. The ability to tune this way is characteristic of transistors and of no other discharge device known to the electronic art. The present circuit therefore presents a transistorized circuit designed to improve an analogue of the Miller crystal oscillator. As such, the principle of its oscillation is understandable by consideration that the capacitance between collector and base can perform a feedback function similar to the grid to plate capacitance in a vacuum tube oscillator. The voltage and current in the collector circuit of the figure will be 90° out of phase due to the fact that the collector circuit is loaded with an inductive reactance at the frequency of oscillation. In addition, the feedback current through the capacitance from collector to base, is 90° out of phase with the voltage across this same capacitance. This feedback current injected into the base circuit then has two 90° phase displacements totaling 180° which is the phase displacement of the transistor circuit.

It should also be understood, of course, that the present invention is not limited to use only as a single output crystal oscillator, for example, in double conversion it is possible to take power output at a frequency of 50 megacycles in the particular crystal oscillator shown by way of illustration at point 3 (where $X=50$ megacycles) and simultaneously, to take power output at the harmonic frequency ($Y=150$ megacycles, for example) as shown on the lead 20 tapped off the inductor L1 of tank circuit L1 and C3. Then the frequency at W may be 210 megacycles and beating again in another mixer with the 50 mc. from point 3, the mixer output may be 10 megacycles (mc.). This operation cannot be performed with a vacuum tube oscillator but is possible utilizing the inventive circuit.

It should be further noted that the inductance of the tuned circuit in the collector circuit may be tuned to a harmonic of the mode frequency of the crystal. This operation is unobtainable in a tube crystal oscillator because the tube crystal oscillator will not function at the third or fifth mode if the plate circuit of such an oscillator is tuned to harmonics of these frequencies and there is no other tuned circuit involved.

By way of example only the following components and values were utilized in a satisfactorily operated tested embodiment of the inventive device: $R1=5100$ ohms, $R2=33{,}000$ ohms, $C3=3$ to 12 micromicrofarads, $L1=.1$microhenry. It should be realized, of course, that since R1 establishes the bias current it may readily be varied within 2 to 1 upper and lower limits in accordance with transistor and desired operating characteristics. It should be emphasized also that the above described circuit will give very high power output when operated in accordance with the teachings of the invention at 50 megacycles and also at very high frequencies compared to that frequency so that thus is provided an oscillator satisfying the objects of the invention in providing for superior efficiency and power output while allowing for utmost commercial feasibility and simplicity.

In the mode of operation at 50 megacycles at the output tank L1, C3, very large output power far exceeding predictable values with other types of oscillators is obtained and in addition power may be tapped off at point 3 for other uses. Thus, by employing the inventive circuit an unusual result of output is obtained to enable excellent performance in commercial utilization.

While the principles of the invention have now been made clear, there will be immediately obvious to those skilled in the art many modifications in structure, arrangement, proportions, the elements and components used in the practice of the invention, and otherwise, which are particularly adapted for specific environments and operating requirements without departing from those principles. The appended claims are therefore intended to cover and embrace any such modifications within the limits only of the true spirit and scope of the invention.

What is claimed is:

1. A crystal oscillator comprising a signal translating device, said signal translating device comprising a junction transistor, said junction transistor having an emitter, a circuit base and a collector, a source of negative D.-C. voltage, a resistor disposed between said emitter and said source, capacitance disposed between the emitter of said signal translating device and ground, and an output tuned circuit connected to said collector, said last-named tuned circuit being tuned inductively, an input circuit to said circuit base comprising a crystal and a resistor disposed in parallel between the circuit base and ground, said transistor having interelectrode capacitance between said collector and said base to thereby provide a high frequency oscillator which when said tank circuit is tuned inductively will provide regenerative feedback through said transistor to sustain oscillations in a stable configuration.

2. A high frequency oscillator comprising a semiconductor having elements comprising an emitter, a collector and at least one base, means to provide power to emitter, capacitance being disposed between said emitter and ground, an output inductively tuned parallel tank circuit leading from said collector, an input circuit disposed between said base and ground comprising a crystal oscillator and a resistor in parallel, said semiconductor having characteristics of feedback therethrough and of capacitance between said collector and said base such that upon application of power to said emitter, feedback in phase from the collector to the base will occur due to the collector to base capacitance to provide for 90° phase shift of output signal fed back and the inductance of said output tank circuit provides for an additional 90° phase shift to thereby provide regenerative feedback to said base to sustain oscillations.

3. In an oscillator circuit, a junction transistor, said junction transistor comprising a collector, at least one base and an emitter, a source of D.-C. voltage, a resistor disposed between said emitter and said source D.-C. voltage, capacitance disposed between said emitter and ground, a crystal and a resistor in parallel disposed between ground and said base to form a parallel input circuit, an inductively tuned output circuit comprising an inductor and a capacitor in parallel disposed between said collector and ground, whereby said inductively tuned output circuit will provide for 90° phase displacement of the signal output of said junction transistor, said junction transistor having capacitance disposed between said collector and said base to thereby delay the output fed back to said base by an additional 90° to thereby cause regeneration to occur and oscillations to be sustained.

4. A junction transistor oscillator comprising a collector, an emitter, and a first and a second base, a resistor disposed between said emitter and said second base, a source of negative voltage disposed at the junction between said resistor and said base, an input crystal circuit disposed between said first base and ground and capacitively reactive in nature, capacitance being disposed between said emitter and ground, said last-named capacitance compensating for the capacitive reactance of said base input circuit to thereby provide an anti-resonant condition of said input circuit having a high impedance and unity power factor to provide for resonance at predetermined frequency, and an inductively tuned output circuit connected to said collector, the inductive tuning providing for a 90° phase shift in the current output at said collector and capacitive feedback due to capacitive reactance between said collector and said first base to provide an additional 90° phase shift to thereby provide for regenerative feedback to said high impedance unity power factor input circuit.

5. The apparatus of claim 4 wherein said crystal is operated at its third mode and wherein said inductively tuned output circuit is tuned to a multiple harmonic of the frequency of the crystal.

6. In a crystal oscillator, a junction transistor including a collector, an emitter, a first base and a second base, and having capacitance between said collector and said first base, a D.-C. source of negative voltage, a resistor disposed between said emitter and said D.-C. source, capacitance being disposed between said emitter and ground, an input circuit to said first base base comprising a crystal and a resistor in parallel between said first base and ground to form a parallel input tank circuit, an output tank circuit comprising an inductor and a capacitor in parallel disposed between said collector and ground, and means to cause the output tank to be inductive to thereby provide for a 90° phase shift of output waveform at the collector and in the capacitive feedback path between the collector and first base to thereby provide a substantially 180° phase reversal in the waveform from the output at the collector to the input at said first base and thus provide regenerative feedback, and means to take a second output from the first base of said oscillator, the capacitive reactance disposed between the emitter and ground serving to balance the capacitive reactance of the input circuit to said first base to thereby provide an input anti-resonant condition in the input circuit wherein there will be a high impedance and unity power factor in resonant condition.

7. The apparatus of claim 6 wherein said crystal is operated at a mode higher than the first mode and said output circuit is operated at a harmonic of the crystal frequency such that adequate power for injection into a mixer circuit at desired frequency can be obtained from the oscillator collector tank circuit.

References Cited in the file of this patent

UNITED STATES PATENTS

| | | |
|---|---|---|
| 2,755,384 | Pierson et al. | July 17, 1956 |
| 2,811,646 | Huo-Bing Yin | Oct. 29, 1957 |